US009123276B2

(12) United States Patent
Park et al.

(10) Patent No.: US 9,123,276 B2
(45) Date of Patent: Sep. 1, 2015

(54) DISPLAY SUBSTRATE AND METHOD OF MEASURING PATTERN DIMENSIONS OF DISPLAY SUBSTRATE

(71) Applicant: SAMSUNG DISPLAY CO., LTD., Yongin, Gyeonggi-Do (KR)

(72) Inventors: Yong Jun Park, Yongin-Si (KR); HyungJun Kim, Yongin-Si (KR); Young Suk Lee, Hwaseong-Si (KR); Jongsoo Lee, Asan-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 144 days.

(21) Appl. No.: 13/834,858

(22) Filed: Mar. 15, 2013

(65) Prior Publication Data

US 2014/0153002 A1    Jun. 5, 2014

(30) Foreign Application Priority Data

Nov. 30, 2012   (KR) .................. 10-2012-0138073

(51) Int. Cl.
*G01B 11/14* (2006.01)
*G09G 3/00* (2006.01)
*G03F 7/20* (2006.01)

(52) U.S. Cl.
CPC ............ *G09G 3/006* (2013.01); *G03F 7/70625* (2013.01)

(58) Field of Classification Search
USPC ............... 356/625–628, 630–636; 257/48; 349/38, 39, 42, 43, 128, 129, 136; 345/90, 92
See application file for complete search history.

(56) References Cited

U.S. PATENT DOCUMENTS

| 6,115,087 | A | * | 9/2000 | Ohi ................................ 349/38 |
| 2003/0223087 | A1 | * | 12/2003 | Sasazawa et al. ............ 356/636 |
| 2007/0184565 | A1 | | 8/2007 | Park et al. |
| 2007/0242263 | A1 | | 10/2007 | Huang et al. |
| 2009/0186428 | A1 | | 7/2009 | Huang et al. |
| 2011/0207244 | A1 | | 8/2011 | Sung et al. |

FOREIGN PATENT DOCUMENTS

| JP | 2000-243288 | 9/2000 |
| KR | 10-1999-0053756 | 7/1999 |
| KR | 10-2004-0093939 | 11/2004 |
| KR | 10-0499428 | 7/2005 |
| KR | 10-2005-0104575 | 11/2005 |
| KR | 10-0943284 | 2/2010 |

(Continued)

OTHER PUBLICATIONS

English Abstract for Publication No. 2000-243288.

(Continued)

*Primary Examiner* — Tri T Ton
(74) *Attorney, Agent, or Firm* — F. Chau & Associates, LLC

(57) ABSTRACT

A display panel includes a plurality of pixel areas and at least one inspection area. An incident light is irradiated onto an inspection pattern disposed in the inspection area and a reflection light reflected by the inspection pattern is detected. An optical critical dimension of the inspection pattern is calculated from the reflection light, and a dimension of a pixel pattern disposed in each pixel area is calculated from the optical critical dimension of the inspection pattern. Accordingly, the dimension of the pixel pattern may be indirectly measured from the inspection pattern.

8 Claims, 10 Drawing Sheets

(56) References Cited

FOREIGN PATENT DOCUMENTS

KR   10-2010-0053076   5/2010
KR   10-0991954        11/2010
KR   10-1005179        1/2011

OTHER PUBLICATIONS

English Abstract for Publication No. 10-2002-0063184 (FOR 10-0499428).
English Abstract for Publication No. 10-2004-0093939.
English Abstract for Publication No. 10-2010-0053076.
English Abstract for Publication No. 10-2004-0093907 (FOR 10-0991954).
English Abstract for Publication No. 10-2005-0003282 (FOR 10-0943284).
English Abstract for Publication No. 10-1999-0053756.
English Abstract for Publication No. 10-2005-0104575.
English Abstract for Publication No. 10-2010-0085595 (FOR 10-1005179).
Richard Silver, et al., Fundamental Limits of Optical Critcal Dimension Metrology: A Simulation Study,: Proceedings of SPIE vol. 6518, pp. 65180U-1 to 65180U-17.

* cited by examiner

DISPLAY SUBSTRATE AND METHOD OF MEASURING PATTERN DIMENSIONS OF DISPLAY SUBSTRATE

CROSS-REFERENCE TO RELATED APPLICATION

This U.S. non-provisional patent application claims priority under 35 U.S.C. §119 from Korean Patent Application No. 10-2012-0138073, filed on Nov. 30, 2012 in the Korean Intellectual Property Office, the contents of which are herein incorporated by reference in their entirety.

BACKGROUND

1. Technical Field

The present disclosure is directed to a display substrate and a method of measuring pattern dimensions of the display substrate. More particularly, the present disclosure is directed to a display substrate including an inspection pattern and a method of measuring pattern dimensions of the display substrate using an optical critical dimension measuring method.

2. Discussion of the Related Art

In general, a display apparatus includes a display panel in which a plurality of pixels is arranged. For example, a liquid crystal display panel includes two display substrates and a liquid crystal layer disposed between the two display substrates. The liquid crystal display panel controls a transmittance of light passing through the pixels to display an image.

Each pixel includes at least one thin film transistor and a pixel electrode. The pixel electrode includes patterns, such as cut-away portions. The thin film transistor includes patterns, e.g., a gate electrode, a drain electrode, a source electrode, an active layer, etc. In addition, the display panel further includes a plurality of thin film layers. The thin film layers are patterned according to areas of the display substrate.

The patterns may be formed by a variety of processes, such as deposition, exposure, development, and etch processes. The patterns are formed to correspond to desired dimensions within an error range. When the dimensions of the electrodes of the thin film transistor and the patterns of the pixel electrode deviate from the error range, the pixel becomes a dead pixel.

To inspect whether the patterns have dimensions within the error range, a scanning electron microscope or a critical dimension meter is used.

SUMMARY

Embodiments of the present disclosure provide a display substrate capable of measuring a dimension of a pixel patterns using an inspection pattern.

Embodiments of the present disclosure provide a method of measuring a pattern dimension of the display substrate.

Embodiments of the inventive concept provide a display substrate including a base substrate, a plurality of gate lines disposed on the base substrate, and a plurality of data lines disposed on the base substrate. The base substrate includes a plurality of pixel areas and at least one inspection area. A plurality of pixels is disposed in the pixel areas, respectively, and an inspection pattern is disposed in at least one inspection area.

Each of the pixels includes a thin film transistor and a pixel electrode. The thin film transistor is connected to a corresponding gate line and a corresponding data line. The pixel electrode is connected to the thin film transistor and includes at least one cut-away portion. The inspection pattern includes a plurality of diffraction grids.

Embodiments of the inventive concept provide a method of measuring a pattern dimension of a display substrate by using an optical critical dimension measuring method. To this end, an incident light is irradiated onto an inspection pattern disposed in the inspection area and a reflection light reflected by the inspection pattern is detected. An optical critical dimension of the inspection pattern is calculated from the reflection light, and a dimension of a pixel pattern disposed in each pixel area is calculated from the optical critical dimension of the inspection pattern. Accordingly, the dimension of the pixel pattern may be indirectly measured from the inspection pattern.

The inspection pattern includes a plurality of diffraction grids extending in a first direction and spaced apart from each other in a second direction. A width of each diffraction grid corresponds to a wavelength of the incident light.

The optical critical dimension of the inspection pattern includes at least one of the width in the second direction of the diffraction grids, a distance between adjacent diffraction grids, and a height of the diffraction grids.

The display substrate includes a base substrate, a plurality of gate lines disposed on the base substrate, a plurality of data lines crossing the gate lines, and a plurality of pixels disposed in the pixel areas, respectively.

Each of the pixels includes a thin film transistor connected to a corresponding gate line and a corresponding data line and a pixel electrode connected to the thin film transistor that includes at least one cut-away portion. The pixel pattern includes at least one of a portion of the thin film transistor and the cut-away portion.

The diffraction grids may include a plurality of first diffraction grids and a plurality of second diffraction grids disposed on a different layer from the first diffraction grids.

The thin film transistor and the pixel electrode are disposed on different layers from each other, the first diffraction grids may be disposed on the same layer as the p thin film transistor, and the second diffraction grids may be disposed on the same layer as the pixel electrode.

The first diffraction grids may include a same material as the thin film transistor, and the second diffraction grids include a same material as the pixel electrode.

The inspection area may correspond to a portion of at least one pixel area.

An area of a pixel disposed in the at least one pixel area having an inspection area is smaller than an area of a pixel disposed in a pixel area not having an inspection area.

Embodiments of the inventive concept provide another method of measuring a pattern dimension of a display substrate by using an optical critical dimension measuring method. To this end, an optical critical dimension of an inspection pattern of a display substrate is calculated from light reflected by the inspection pattern, and a dimension of a pixel pattern disposed in each of a plurality of pixel areas in the display substrate is calculated from the optical critical dimension of the inspection pattern. The inspection pattern comprises a plurality of diffraction grids extending in a first direction and spaced apart from each other in a second direction, and the optical critical dimension of the inspection pattern comprises at least one of the width in the second direction of the diffraction grids, a distance between adjacent diffraction grids, and a height of the diffraction grids.

The method further includes irradiating incident light onto the inspection pattern of a display substrate, and detecting reflection light reflected by the inspection pattern. A width of each diffraction grid corresponds to a wavelength of the incident light. The display substrate includes a plurality of pixels disposed in the pixel areas and one or more inspection areas, the inspection pattern being disposed in at least one inspection area of the inspection areas.

Each of the pixels includes a thin film transistor, and a pixel electrode connected to the thin film transistor that includes at least one cut-away portion. The pixel pattern includes at least one of a portion of the thin film transistor and the cut-away portion, and the thin film transistor and the pixel electrode are disposed on different layers.

The inspection area may correspond to a portion of at least one pixel area.

The diffraction grids may further comprise a plurality of first diffraction grids disposed on the same layer as a portion of the thin film transistor and a plurality of second diffraction grids disposed on the same layer as the pixel electrode. The first diffraction grids may comprise a same material as the portion of the thin film transistor, and the second diffraction grids may comprise a same material as the pixel electrode.

According to the above, the dimensions of the pixel patterns may be calculated from the inspection pattern disposed on the display substrate. The dimensions of the pixel patterns may be indirectly measured from the difference between the designed dimension of the inspection pattern and the measured critical dimension of the inspection pattern.

The critical dimension of the inspection pattern is measured by the optical critical dimension measuring method. The optical critical dimension measuring method is a non-contact type optical measuring method that does not damage the display substrate. Thus, the optical critical dimension method may rapidly and accurately measure the critical dimension of the inspection pattern.

Although the dimension of the pixel pattern is outside the range that can be directly measured by the optical critical dimension measuring method, the dimension of the pixel pattern may be measured from the inspection pattern that can be measured by the optical critical dimension measuring method.

DETAILED DESCRIPTION OF EXEMPLARY EMBODIMENTS

It will be understood that when an element or layer is referred to as being "on", "connected to" or "coupled to" another element or layer, it can be directly on, connected or coupled to the other element or layer or intervening elements or layers may be present. Like numbers may refer to like elements throughout.

Hereinafter, exemplary embodiments of the present disclosure will be explained in detail with reference to the accompanying drawings.

Figure 1:
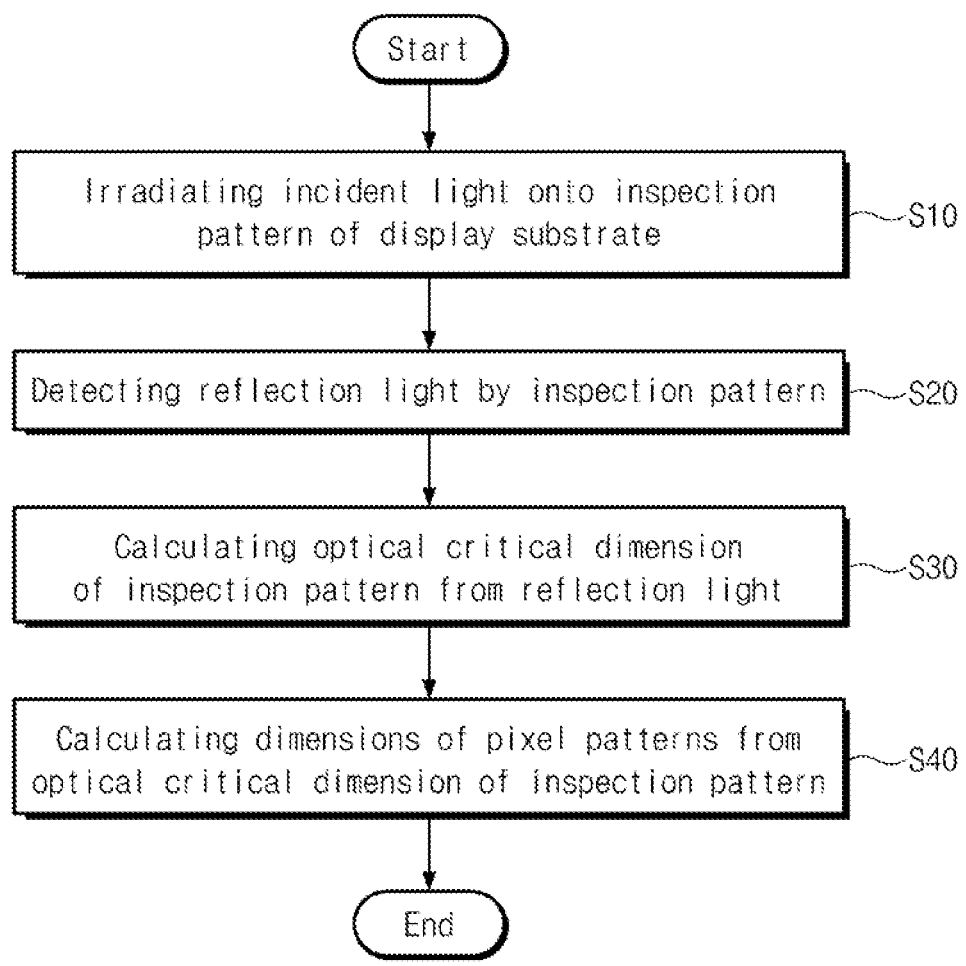
FIG. 1 is a flowchart of a method of measuring a pattern dimension of a display substrate according to an exemplary embodiment of the present disclosure.

FIG. 1 is a flowchart of a method of measuring a pattern dimension of a display substrate according to an exemplary embodiment of the present disclosure.

Referring to FIG. 1, incident light is irradiated onto an inspection pattern of a display substrate (S10). The incident light is reflected, refracted, and diffracted by the inspection pattern. Finally, the reflected light and the diffracted light are reflected by the inspection pattern.

The display substrate is a portion of the display panel. The display panel may be, but is not limited to, a liquid crystal display panel, an electrophorectic display panel, an electrowetting display panel, or an organic light emitting display panel.

The inspection pattern is disposed on a portion of the display substrate. The inspection pattern is disposed on the same layer as one of patterns disposed on the display substrate and formed by the same process used to form one of the patterns disposed on the display substrate.

Figure 2:
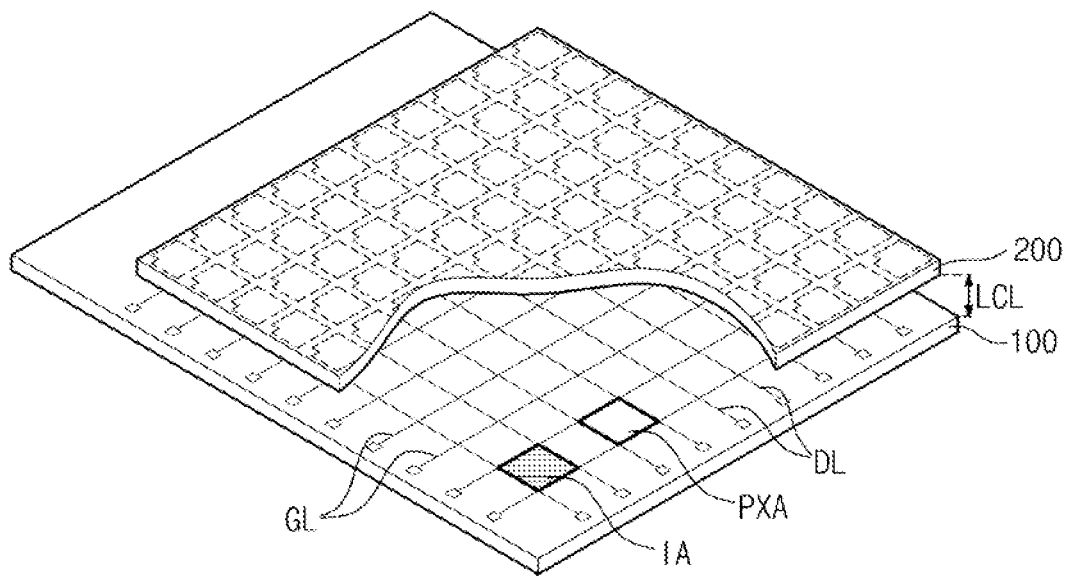
FIG. 2 is a perspective view of a display panel according to an exemplary embodiment of the present disclosure.
Figure 3:
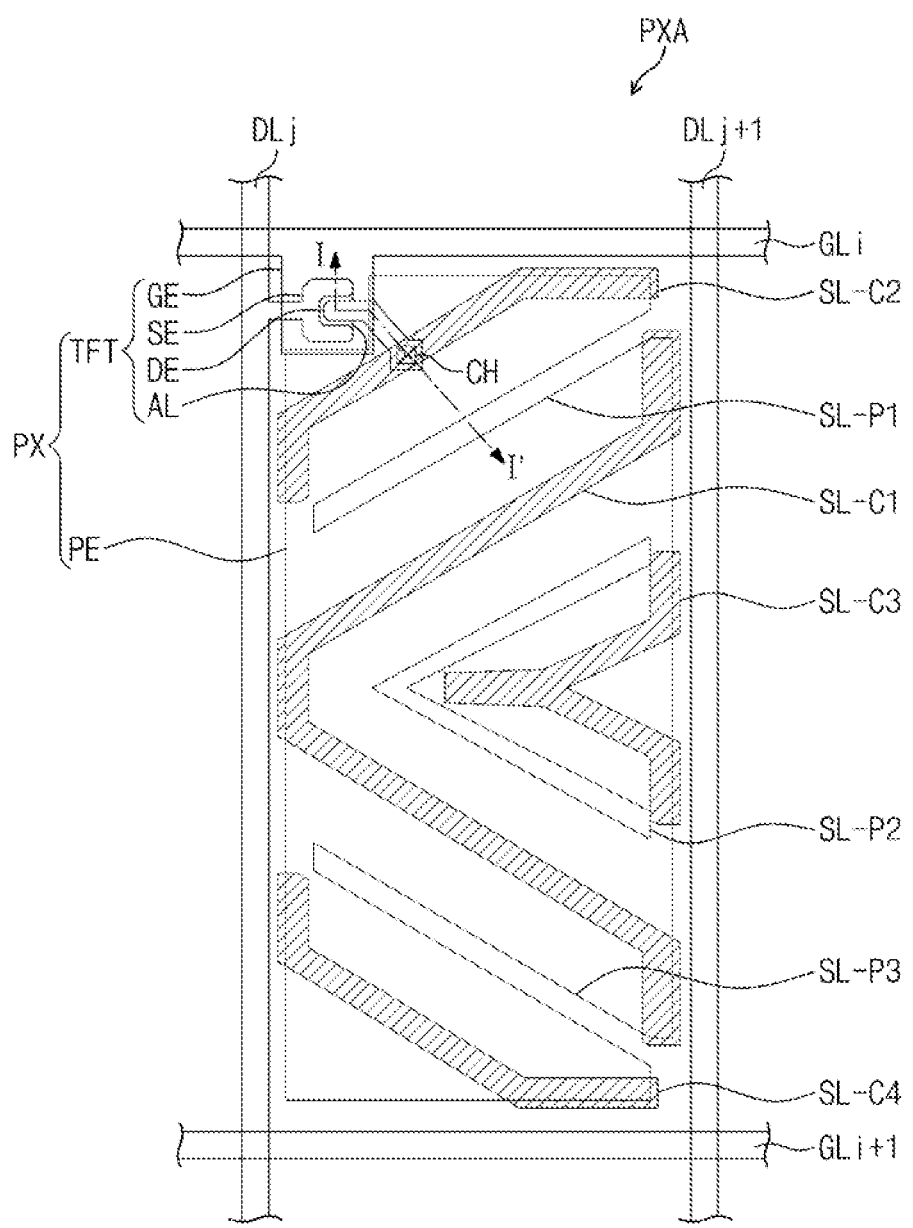
FIG. 3 is a plan view of a pixel area shown in FIG. 2.
Figure 4:
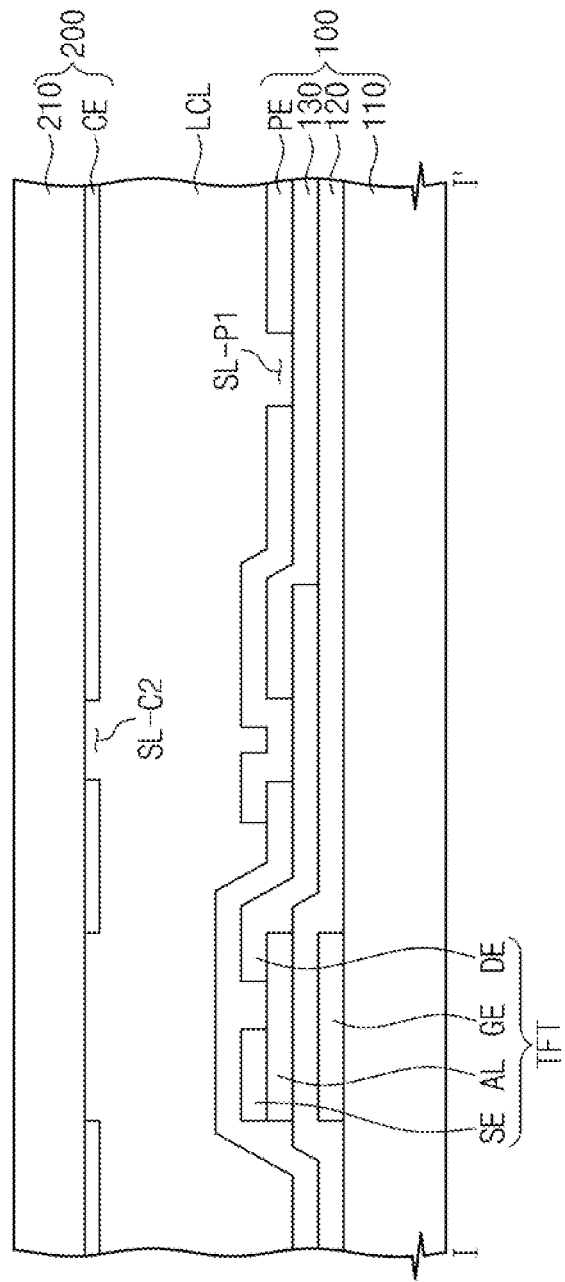
FIG. 4 is a cross-sectional view of a display panel taken along a line of FIG. 3.
Figure 5:
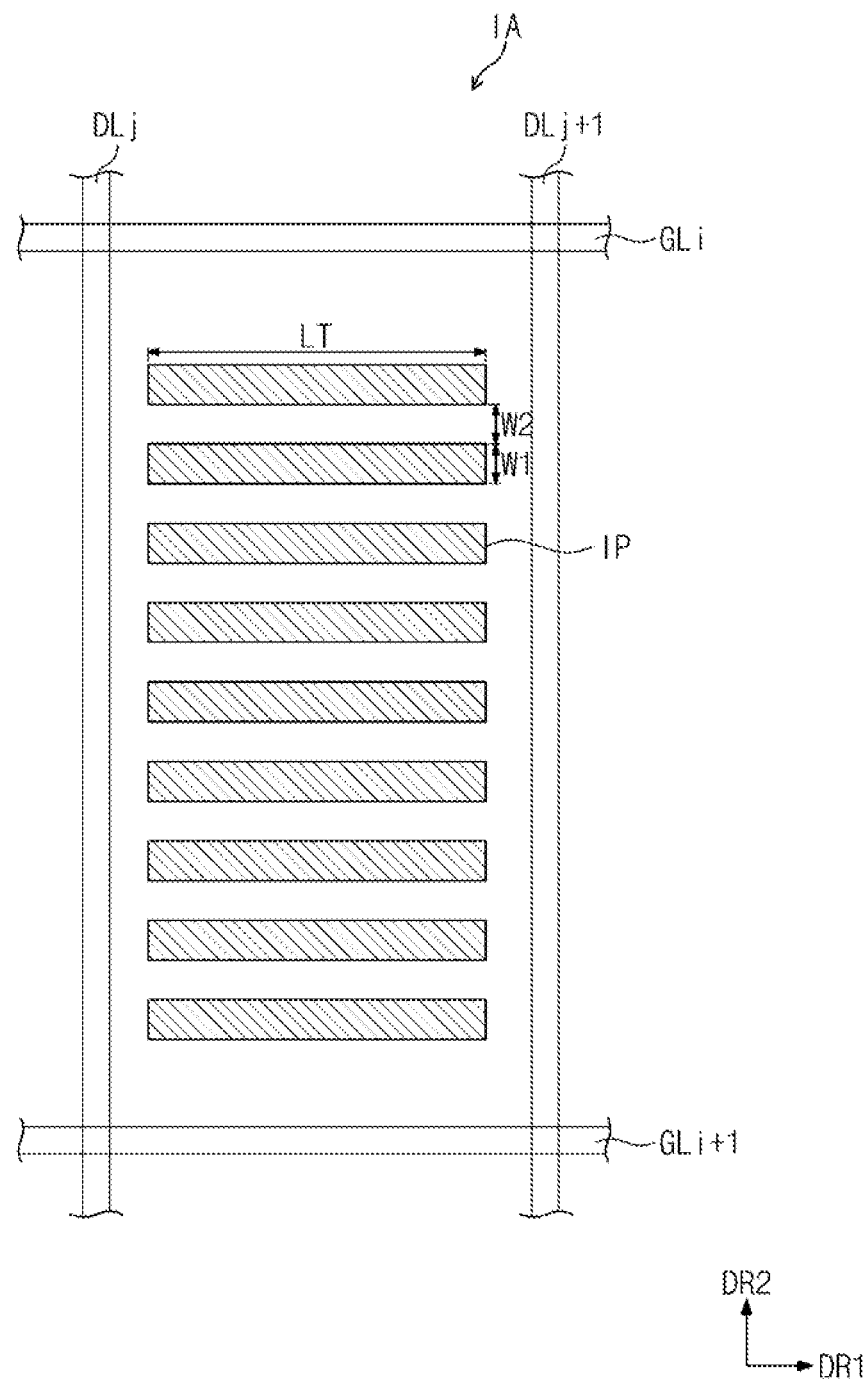
FIG. 5 is a plan view of an inspection area shown in FIG. 2.

Hereinafter, the display substrate and the inspection pattern will be described in detail with reference to FIGS. 2 to 5. FIG. 2 is a perspective view of a display panel according to an exemplary embodiment of the present disclosure, FIG. 3 is a plan view of a pixel area shown in FIG. 2, FIG. 4 is a cross-sectional view of a display panel taken along a line I-I' of FIG. 3, and FIG. 5 is a plan view of an inspection area shown in FIG. 2. In a present exemplary embodiment, a liquid crystal display panel will be described as a non-limiting representative example.

Referring to FIG. 2, the liquid crystal display panel includes a first display substrate 100, a second display substrate 200, and a liquid crystal layer LCL interposed between the first display substrate 100 and the second display substrate 200.

The first display substrate 100 includes a first base substrate 110, a plurality of gate lines GL disposed on the first base substrate 110, and a plurality of data lines DL disposed on the first base substrate 110. The gate lines GL receive gate signals and the data lines DL receive data signals.

The gate lines GL are insulated from the data lines DL while crossing the data lines DL. For example, the gate lines GL are disposed on a different layer from the data lines DL. An organic or inorganic layer may be disposed between the gate lines GL and the data lines DL.

In addition, the first display substrate 100 includes a plurality of pixel areas PXA and at least one inspection area IA. A plurality of pixels is arranged in the pixel areas PXA. Each pixel is connected to a corresponding gate line of the gate lines GL and a corresponding data line of the data lines DL. An inspection pattern IP is disposed in the inspection area IA.

FIGS. 3 and 4 show one pixel PX disposed in one pixel area PXA. The pixel PX includes a thin film transistor TFT and a pixel electrode PE. The thin film transistor TFT includes a gate electrode GE, an active layer AL, a source electrode SE, and a drain electrode DE. The pixel electrode PE includes at least one first cut-away portion SL-P1 to SL-P3. The first cut-away portions SL-P1 to SL-P3 are formed by partially removing the pixel electrode PE.

The gate electrode GE branches from one gate line GLi of the gate lines GLi and GLi+1. A gate insulating layer 120 is disposed on the first base substrate 110 to cover the gate line GLi and the gate electrode GE.

The active layer AL is disposed on the gate electrode GE with the gate insulating layer 120 interposed therebetween. When viewed in a plan view, the active layer AL overlaps the gate electrode GE. The active layer AL may include a semiconducting metal oxide.

The data lines DLj and DLj+1 are disposed on the gate insulating layer 120. The source electrode SE branches from one data line DLj of the data lines DLj and DLj+1. The source electrode SE partially overlaps the gate electrode GE and the active layer AL when viewed in a plan view.

In addition, the drain electrode DE is spaced apart from the source electrode SE when viewed in a plan view. The drain electrode DE partially overlaps the gate electrode GE and the active layer AL when viewed in a plan view.

A protective layer 130 is disposed on the first base substrate 110 to cover the drain electrode DE, the source electrode SE, and the data line DLj. The pixel electrode PE is disposed on the protective layer 130 to be connected to the drain electrode DE. The drain electrode DE and the pixel electrode PE are connected to each other through a contact hole CH that penetrates the protective layer 130.

The pixel area PXA is partitioned into plural domains by the first cut-away portions SL-P1 to SL-P3 partitions. As shown in FIG. 3, the pixel electrode PE includes three first cut-away portions SL-P1 to SL-P3. The three first cut-away portions SL-P1 to SL-P3 have shapes that differ from each other. Each of the first cut-away portions SL-P1 to SL-P3 has a width in a range from about a few micrometers to about tens of micrometers.

The common electrode CE is disposed on a surface of a second base substrate 210. FIG. 3 shows cut-away portions SL-C1 to SL-C4 (hereinafter, referred to as second cut-away portions) of the common electrode CE overlapped with the pixel electrode PE. The second cut-away portions SL-C1 to SL-C4 are disposed to correspond to the pixel areas PXA. Due to the first cut-away portions SL-P1 to SL-P3 and the second cut-away portions SL-C1 to SL-C4, a deformed electric field is formed between the pixel electrode PE and the common electrode CE. The deformed electric field forms domains having different arrangements of liquid crystal molecules of the liquid crystal layer LCL.

In a present exemplary embodiment, the gate electrode GE, the active layer AL, the source electrode SE, and the drain electrode DE of the thin film transistor TFT and the first cut-away portions SL-P1 to SL-P3 of the pixel electrode PE are referred to as pixel patterns. The pixel patterns may further include the data lines and the gate lines.

FIGS. 3 and 4 show a patterned vertical alignment (PVA) mode liquid crystal display panel, but the liquid crystal display panel is not limited to the PVA mode. That is, the liquid crystal display panel may be an in-plane switching (IPS) mode or fringe-field switching (FFS) mode liquid crystal display panel, whose pixel patterns differ from those of the PVA mode liquid crystal display panel. In addition, the pixel patterns may include periodically-repeated patterns or irregularly-arranged patterns.

Each pixel pattern is designed to have a specific dimension before the first display substrate 100 is manufactured. The dimensions of a pixel pattern include a width, a thickness, and a taper angle of each pattern.

Referring to FIG. 5, the inspection area IA corresponds to an area of the first display substrate 100 in which the pixel PX is not formed. The inspection area IA is defined by the two adjacent gate lines GLi and GLi+1 and the two adjacent data lines DLj and DLj+1, but is not limited thereto.

The inspection pattern IP is formed in the inspection area IA and includes a plurality of diffraction grids. Each of the diffraction grids extends in a first direction DR1 and are spaced apart from each other in a second direction DR2. Each diffraction grid may have the same shape.

Each of the diffraction grids has a length LT of about 80 micrometers in the first direction DR1 and a width W1 of about 2 micrometers in the second direction DR2. A distance W2 in the second direction DR2 between the diffraction grids is about 2 micrometers.

However, the width W1 and the distance W2 are not be limited thereto. That is, the width W1 in the second direction DR2 may be in a range from about 100 nanometers to about 5 micrometers and the distance W2 in the second direction DR2 may be in a range from about 100 nanometers to about 5 micrometers. The ranges are determined by the optical critical dimension measuring method, and correspond to a wavelength of the incident light irradiated onto the inspection pattern. The optical critical dimension measuring method utilizes incident light having a wavelength range of about 100 nanometers to about 10 micrometers. When the dimensions of the diffraction grids deviate from these ranges, the optical critical dimension measuring method utilizing incident light in the aforementioned wavelength range is not applied. For example, the width of the first cut-away portions SL-P1 to SL-P3, which is in the range of a few micrometers to tens of micrometers, may not be measured by the optical critical dimension measuring method.

The inspection pattern IP may be disposed on the same layer as one of the gate electrode GE, the active layer AL, the source electrode SE, and the drain electrode DE of the thin film transistor TFT. The inspection pattern IP may be formed of the same material as one of the gate electrode GE, the active layer AL, the source electrode SE, and the drain electrode DE of the thin film transistor TFT. In addition, the inspection pattern IP may be disposed on the same layer as the pixel electrode PE and formed of the same material as the pixel electrode PE.

Referring to FIG. 1 again, the reflection light reflected by the inspection pattern is detected (S20). The reflection light is reflected, refracted, and diffracted by the inspection pattern IP and includes information about the critical dimensions of the inspection pattern IP. The information in the reflection light may vary depending on the material, thickness, distance, and width of the diffraction grids.

Meanwhile, the incident light and the reflection light are respectively irradiated and detected by the optical critical dimension measuring apparatus.

Figure 6:
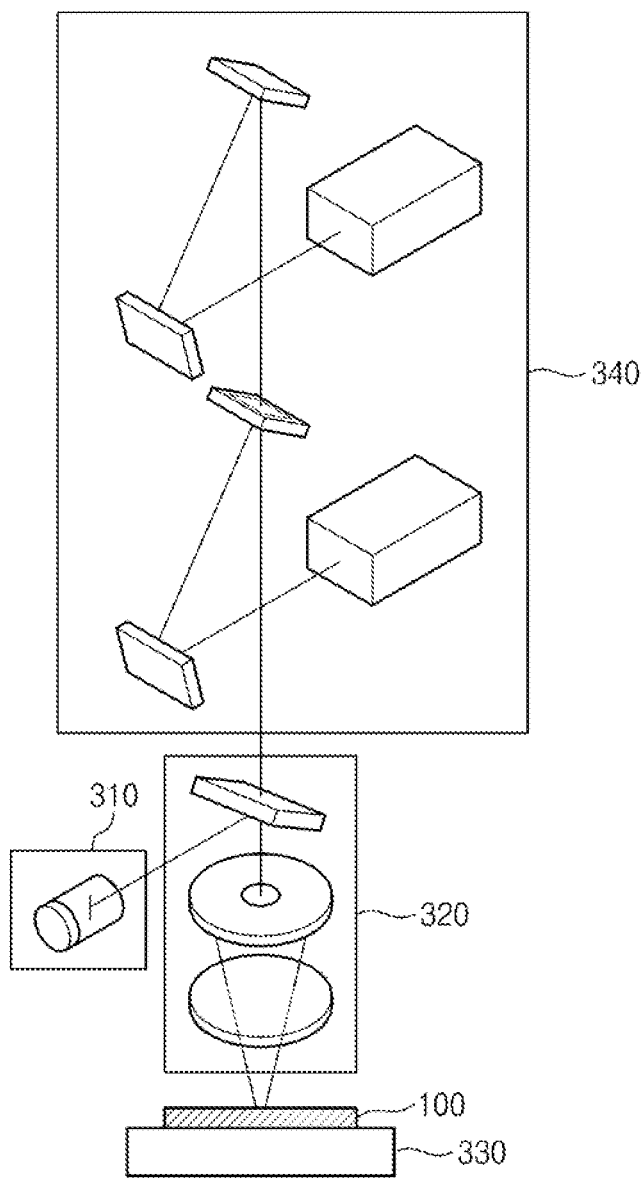
FIG. 6 is a perspective view of an optical critical dimension measuring apparatus.

FIG. 6 is a perspective view showing an optical critical dimension measuring apparatus.

Referring to FIG. 6, an optical critical dimension measuring apparatus includes a light source 310, an irradiation unit 320, a stage 330, and a spectrometer unit 340. The light emitted from the light source 310 is irradiated onto the inspection pattern IP of the first display substrate 100 disposed on the stage 330 through the irradiation unit 320. The light reflected from the inspection pattern IP is detected by the spectrometer unit 340.

Referring to FIG. 1 again, the critical dimensions of the inspection pattern IP are calculated from the reflection light (S30). The critical dimensions may be calculated by measuring a reflectivity of each wavelength of the reflection light. The critical dimensions may be calculated by measuring a phase and an amplitude of the reflection light (e.g., ellipsometry).

The reflection light reflected from the diffraction grids is analyzed by a rigorous coupled-wave analysis (RCWA). The light incident to the diffraction grids is refracted one or more times, and thus the reflection light may include information about the dimensions of the diffraction grids. The critical dimensions of the inspection pattern IP include information about the width, thickness, and height of the diffraction grids.

Referring to FIG. 1 again, the dimensions of the pixel pattern are calculated from the critical dimensions of the calculated inspection pattern IP (S40). For example, the dimensions of the gate electrode GE are calculated from the critical dimensions of the inspection pattern IP, which are formed through the same process as the gate electrode GE.

The dimensions of the gate electrode GE are measured by the differences between the designed dimensions of the inspection pattern IP and the measured critical dimensions of the inspection pattern IP. A ratio of the designed dimensions of the gate electrode GE and the dimensions of the manufactured gate electrode GE depends on the ratio between the designed dimensions of the inspection pattern IP and the measured critical dimensions of the inspection pattern IP.

The width, thickness, and taper angle of the gate electrode GE may be measured on the basis of the ratio between the designed dimensions of the inspection pattern IP and the measured critical dimensions of the inspection pattern IP. In the same way, the dimensions of the first cut-away portions SL-P1 to SL-P3 may be measured from the critical dimensions of the inspection pattern IP, which are formed through the same process as the pixel electrode PE.

As described above, the dimensions of the pixel pattern may be indirectly measured from the inspection pattern IP. Although the dimensions of the pixel pattern are outside the range that is measurable by the optical critical dimension measuring method, the dimensions of the pixel pattern may be measured from the inspection pattern disposed on the display substrate. In addition, the dimensions of the patterns of the thin film transistor measured from the inspection pattern IP may be more accurate than dimensions of the patterns of the thin film transistor that are directly measured.

Figure 7:
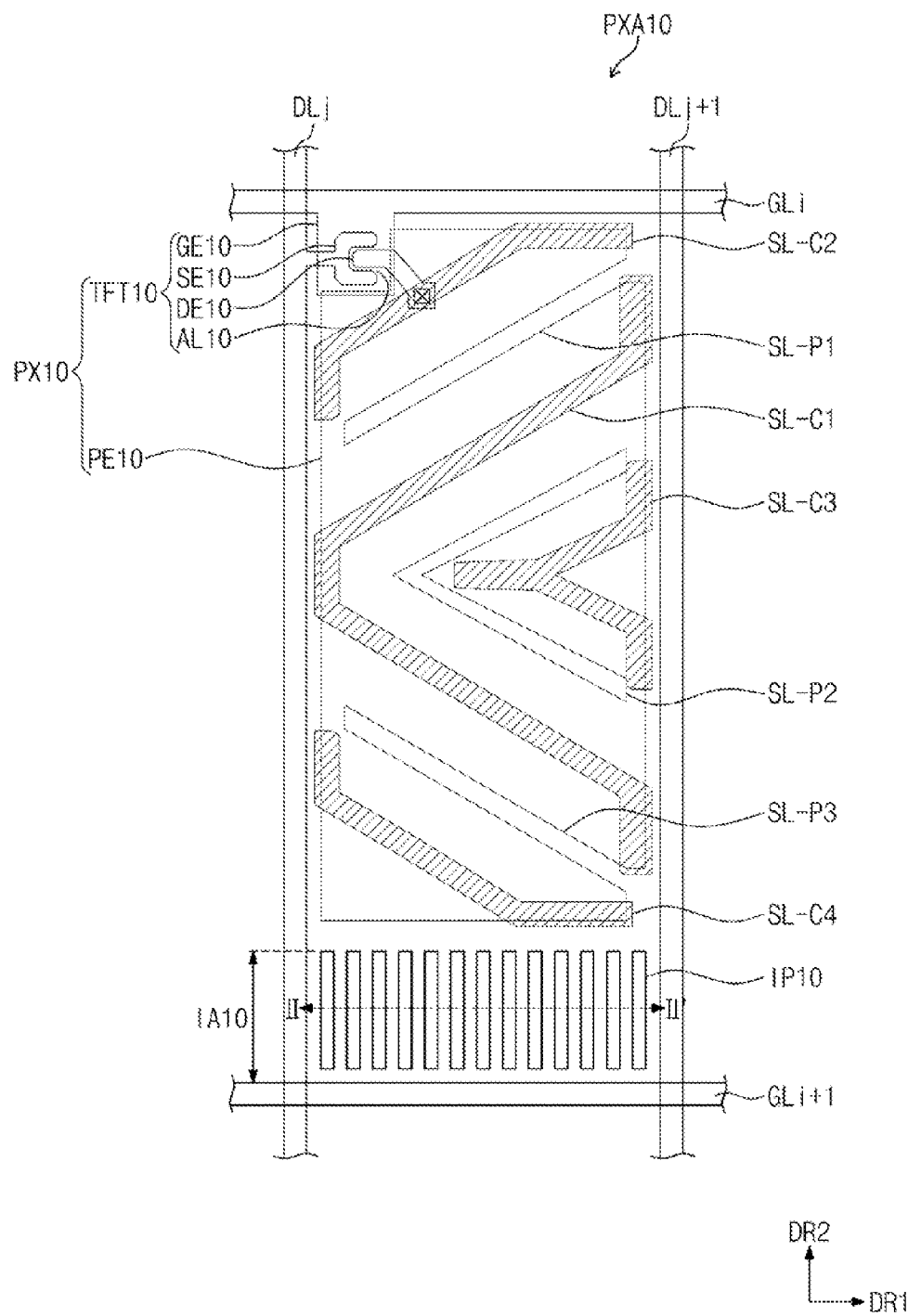
FIG. 7 is a plan view of a pixel area according to an exemplary embodiment of the present disclosure.
Figure 8:
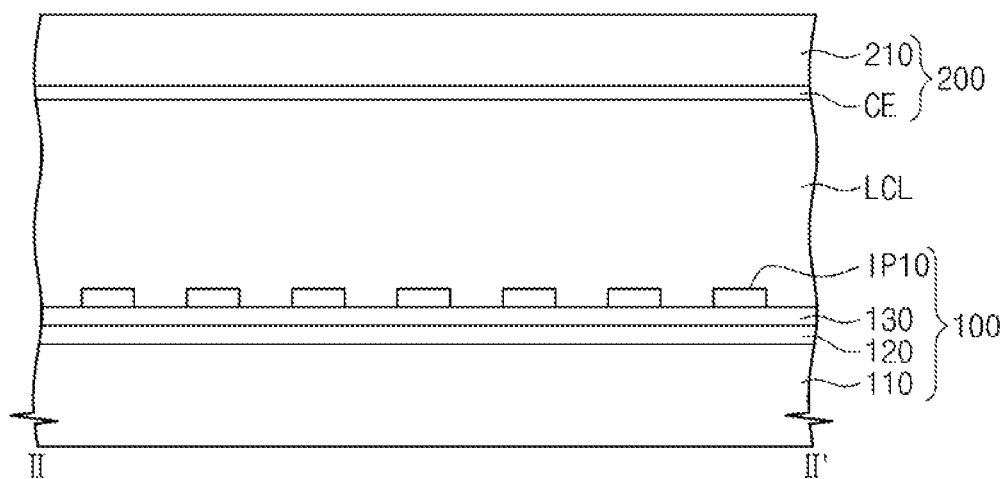
FIG. 8 is a cross-sectional view taken along a line II-IP of FIG. 7.

FIG. 7 is a plan view of a pixel area according to an exemplary embodiment of the present disclosure and FIG. 8 is a cross-sectional view taken along a line II-II' of FIG. 7. Hereinafter, a method of measuring pattern dimensions of the display substrate shown in FIGS. 7 and 8 is disclosed, but the same descriptions as those in FIGS. 1 to 6 will be omitted.

An inspection area IA10 corresponds to a portion of a pixel area PXA10. Different from the display substrate described with reference to FIGS. 3 to 5, a size of the inspection area IA10 is reduced since the inspection area IA10 is disposed in a portion of the pixel area PXA10. The pixel area PXA10 includes an effective pixel in the remaining pixel area.

Referring to FIG. 7, the pixel PX10 is disposed in the pixel area PXA10. The pixel PX10 includes a thin film transistor TFT10 and a pixel electrode PE10. The thin film transistor TFT10 includes a gate electrode GE10, an active layer AL10, a source electrode SE10, and a drain electrode DE10. The pixel electrode PE10 includes at least one first cut-away portions SL-P1 to SL-P3. The thin film transistor TFT10 may have the same structure as that of the thin film transistor TFT shown in FIG. 3.

The pixel electrode PE10 disposed in the pixel area PXA10 is smaller in size than the pixel electrodes disposed in the other pixel areas (not shown) not having an inspection area. A sum of the area of the pixel electrode PE10 and the area of the inspection area IA10 may equal the area of the pixel PX shown in FIG. 3.

As shown in FIG. 7, a plurality of diffraction grids IP10 are disposed in the inspection area IA10. The diffraction grids IP10 extend in the second direction DR2 and are spaced apart from each other in the first direction DR1. Each diffraction grid IP10 has the same shape. A length of the diffraction grids IP10 in the second direction DR2 is shorter than the length of the inspection area IA10 in the first direction DR1.

Referring to FIG. 8, the inspection pattern IP10 is disposed on the protective layer 130. The inspection pattern IP10 is formed of the same material as the pixel electrode PE10.

The inspection pattern IP10 may be disposed on the same layer as one of the gate electrode GE10, the active layer AL10, the source electrode SE10, and the drain electrode DE10 of the thin film transistor TFT10. The inspection pattern IP10 may be formed of the same material as one of the gate electrode GE10, the active layer AL10, the source electrode SE10, and the drain electrode DE10 of the thin film transistor TFT10.

A method of measuring the pattern dimensions of the display substrate shown in FIGS. 7 and 8 is the same as the method of measuring the pattern dimensions of the display substrate described with reference to FIGS. 1 to 6. However, the dimensions of the cut-away portions SL-P1 to SL-P3 are indirectly measured using the inspection pattern IP10 disposed in the inspection area IA10 of the pixel area PXA10 rather than a separate inspection area.

Incident light is irradiated onto the inspection pattern IP10 and reflection light reflected from the inspection pattern IP10 is detected, after which the optical critical dimensions of the inspection pattern IP10 may be calculated from the reflection light. The dimensions of the first cut-away portions SL-P1 to SL-P3 are indirectly measured from the differences between the designed dimensions of the inspection pattern IP10 and the measured optical critical dimensions of the inspection pattern IP10.

For example, a ratio of a designed dimension of the first cut-away portions SL-P1 to SL-P3 to a manufactured dimension of the first cut-away portions SL-P1 to SL-P3 is equal to a ratio of the designed dimensions of the inspection pattern IP10 to the measured optical critical dimensions of the inspection pattern IP10. The manufactured dimensions of the first cut-away portions SL-P1 to SL-P3, which is an unknown value, is calculated from the designed dimensions of the inspection pattern IP10, the measured optical critical dimensions of the inspection pattern IP10 and the designed dimensions of the first cut-away portions SL-P1 to SL-P3, which are known calculated values.

Figure 9:
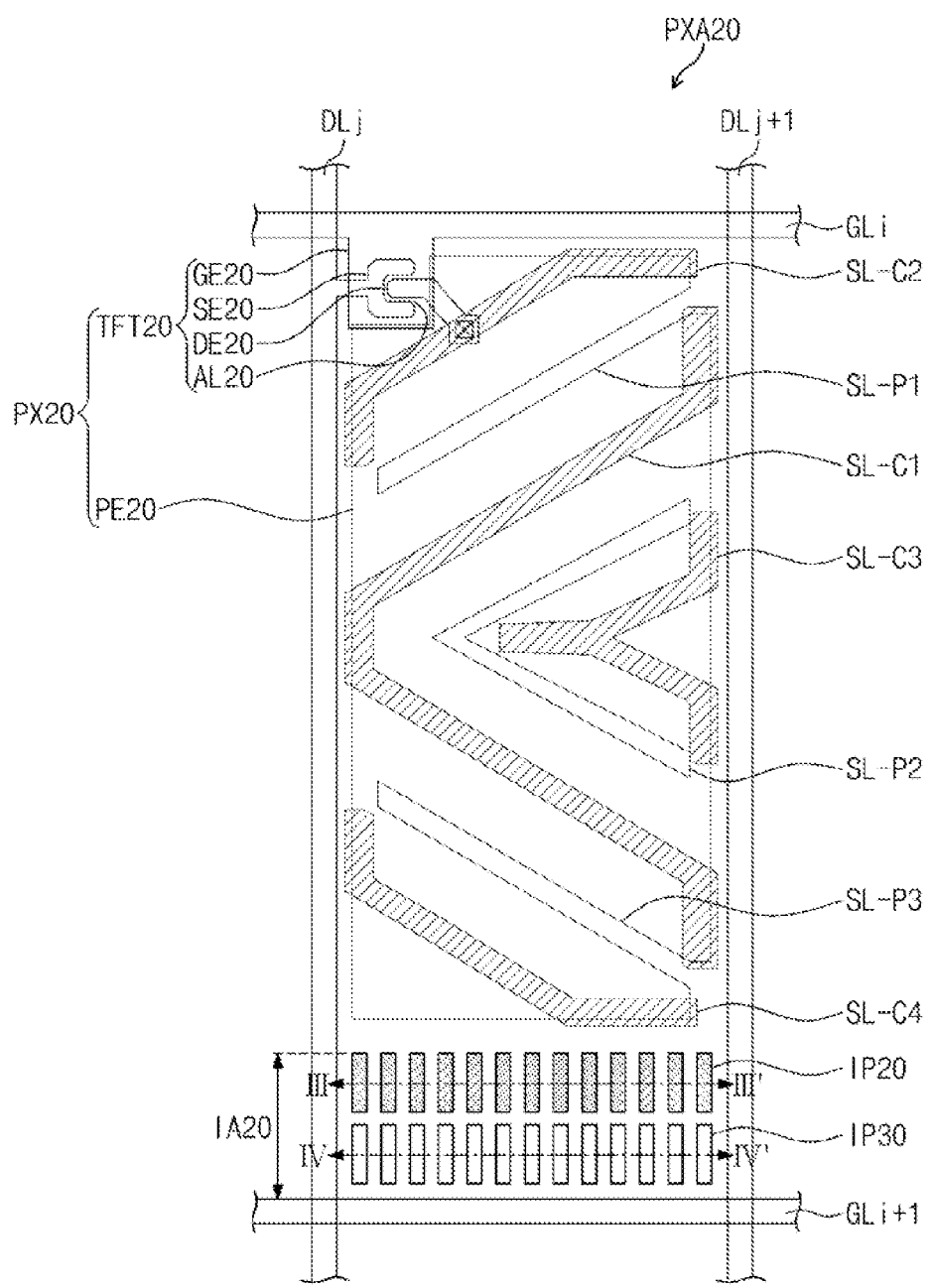
FIG. 9 is a plan view of a pixel area according to an exemplary embodiment of the present disclosure.
Figure 10A:
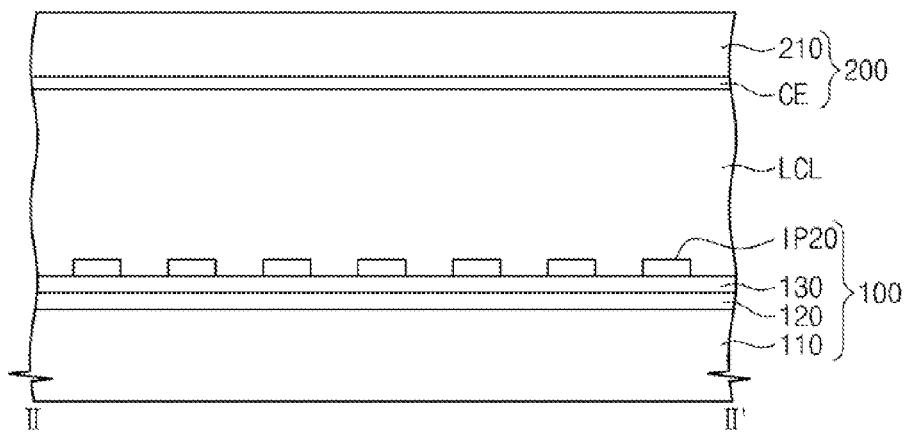
FIG. 10A is a cross-sectional view taken along a line of FIG. 9.
Figure 10B:
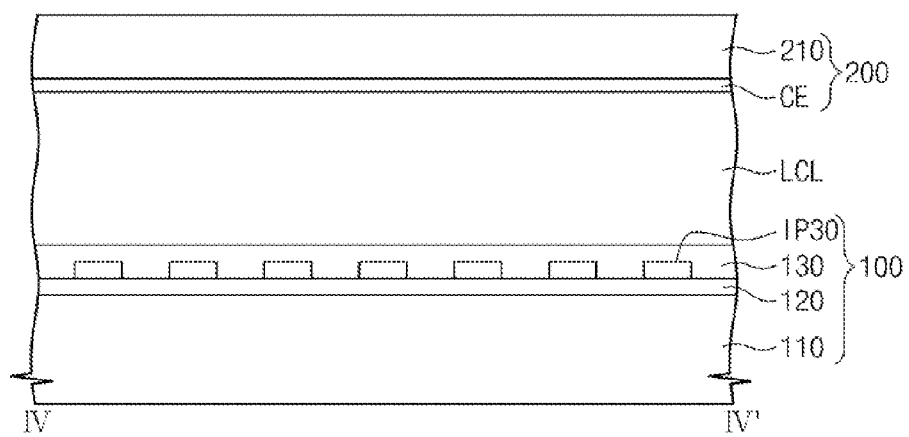
FIG. 10B is a cross-sectional view taken along a line IV-IV' of FIG. 9.

FIG. 9 is a plan view of a pixel area according to an exemplary embodiment of the present disclosure, FIG. 10A is a cross-sectional view taken along a line III-III' of FIG. 9, and FIG. 10B is a cross-sectional view taken along a line IV-IV' of FIG. 9. Hereinafter, a method of measuring pattern dimensions of the display substrate shown in FIGS. 9, 10A, and 10B is disclosed, but the same descriptions as those in FIGS. 7 and 8 will be omitted.

An inspection area IA20 corresponds to a portion of a pixel area PXA20. A pixel PX20 is disposed in the pixel area PXA20 and a plurality of diffraction grids IP20 and IP30 are disposed in the inspection area IA20.

The diffraction grids IP20 and IP30 include a plurality of first diffraction grids IP20 and a plurality of second diffraction grids IP30. The first diffraction grids IP20 are disposed on a different layer from the second diffraction grids IP30. As shown in FIG. 10A, the first diffraction grids IP20 are disposed on the protective layer 130, and the second diffraction grids IP30 are disposed on the gate insulating layer 120 as shown in FIG. 10B.

The first diffraction grids IP20 are formed of the same material as the pixel electrode PE20. The second diffraction grids IP30 may be formed of the same material as a source electrode SE20 or a drain electrode DE20. According to another embodiment, the second diffraction grids IP30 may be disposed on the same layer as the gate electrode GE20 or the active layer AL20 and formed of the gate electrode GE20 or the active layer AL20.

A method of measuring the pattern dimensions of the display substrate shown in FIGS. 9, 10A, and 10B is the same as the method of measuring the pattern dimensions of the display substrate described with reference to FIGS. 1 to 8. According to a present exemplary embodiment, the dimensions of different pixel patterns may be measured from different diffraction grids IP20 and IP30, respectively.

The dimensions of the pixel electrode PE10 are measured from the first diffraction grids IP20, and the dimensions of the gate electrode GE20, the active layer AL20, the source electrode SE20, and the drain electrode DE20 are measured from the second diffraction grids IP30.

Although exemplary embodiments of the present disclosure have been described, it is understood that embodiments of the present disclosure should not be limited to these exemplary embodiments but that various changes and modifications can be made by one ordinary skilled in the art within the spirit and scope of the present disclosure as hereinafter claimed.

What is claimed is:

1. A display substrate comprising:
a base substrate that includes a plurality of pixel areas and at least one inspection area;
a plurality of gate lines disposed on a the base substrate that extend in a first direction;
a plurality of data lines insulated from the gate lines that extend in a second direction crossing the first direction;
a plurality of pixels disposed in the pixel areas, respectively; and
an inspection pattern disposed in at least one inspection area, wherein each of the pixels comprises:
a thin film transistor connected to a corresponding gate line and a corresponding data line; and
a pixel electrode connected to the thin film transistor and including at least one cut-away portion,
wherein the inspection pattern comprises a plurality of diffraction grids extending in the first direction and spaced apart from each other in the second direction, and
wherein the at least one inspection area is disposed between two adjacent gate lines of the plurality of gate lines or two adjacent data lines of the plurality of data lines.

2. The display substrate of claim 1, wherein the at least one inspection area corresponds to a portion of at least one pixel area.

3. The display substrate of claim 2, wherein an area of the pixel disposed in the at least one pixel area having an inspection area is smaller than an area of a pixel disposed in a pixel area not having an inspection area.

4. The display substrate of claim 1, wherein the diffraction grids comprise a plurality of first diffraction grids and a plurality of second diffraction grids disposed on a different layer from the first diffraction grids.

5. The display substrate of claim 4, wherein the thin film transistor and the pixel electrode are disposed on different layers from each other, the first diffraction grids are disposed on the same layer as a portion of the thin film transistor, and the second diffraction grids are disposed on the same layer as the pixel electrode.

6. The display substrate of claim 4, wherein the first diffraction grids comprise a same material as the portion of the thin film transistor, and the second diffraction grids comprise a same material as the pixel electrode.

7. The display substrate of claim 1, wherein the at least one inspection area is surrounded by two adjacent gate lines of the plurality of gate lines and two adjacent data lines of the plurality of data lines.

8. The display substrate of claim 1, wherein one gate line or one data line is disposed between the at least one inspection area and one pixel area adjacent to the at least one inspection area.

* * * * *